United States Patent [19]

Sameshima et al.

[11] Patent Number: 5,777,839
[45] Date of Patent: Jul. 7, 1998

[54] CAPACITOR USING DIELECTRIC FILM

[75] Inventors: Katsumi Sameshima; Teruo Shiba, both of Kyoto, Japan

[73] Assignee: ROHM Co., Ltd., Kyoto, Japan

[21] Appl. No.: 710,936

[22] Filed: Sep. 24, 1996

Related U.S. Application Data

[63] Continuation of Ser. No. 493,528, Jun. 22, 1995, abandoned, which is a continuation of Ser. No. 276,483, Jul. 18, 1994, abandoned, which is a continuation of Ser. No. 966,642, Oct. 26, 1992, abandoned.

[30] Foreign Application Priority Data

Nov. 8, 1991 [JP] Japan ................................ 3-293093

[51] Int. Cl.$^6$ ............................................. H01G 4/38
[52] U.S. Cl. .................... 361/311; 361/322; 361/329; 361/330; 257/295
[58] Field of Search ............................... 361/303, 304, 361/306.1, 311, 312, 313, 321.1, 322, 328, 329, 380; 365/145, 149; 257/295, 310, 532, 535

[56] References Cited

U.S. PATENT DOCUMENTS

| | | | |
|---|---|---|---|
| 1,255,597 | 2/1918 | Giles | 29/25.42 |
| 4,616,290 | 10/1986 | Watanabe et al. | 361/328 |
| 4,723,194 | 2/1988 | Nakamura et al. | 361/330 |
| 4,881,050 | 11/1989 | Swanson | 361/328 |
| 4,980,799 | 12/1990 | Tobita | 361/311 |
| 4,985,926 | 1/1991 | Foster | 361/330 |
| 5,012,385 | 4/1991 | Kurabayashi | 361/328 |
| 5,014,097 | 5/1991 | Kazerouian et al. | 257/535 |
| 5,031,144 | 7/1991 | Persky | 365/145 |
| 5,070,026 | 12/1991 | Greenwald et al. | 365/145 |
| 5,081,559 | 1/1992 | Fazan et al. | 361/313 |
| 5,175,518 | 12/1992 | Swanson | 361/328 |
| 5,270,298 | 12/1993 | Ramesh | 361/313 |

*Primary Examiner*—Teresa J. Walberg
*Assistant Examiner*—Gregory L. Mills
*Attorney, Agent, or Firm*—Nikaido Marmelstein Murray & Oram LLP

[57] ABSTRACT

A capacitor using a dielectric film wherein plural capacitor units each including one or two capacitor elements are formed on an insulator upper electrodes of at least two capacitor elements of different capacitors units are electrically connected. Each of the capacitors includes a lower filmy electrode, a dielectric film formed on the lower filmy electrode, and an upper filmy electrode formed on the dielectric film. Since plural capacitor units are suitably connected to have desired characteristics, a great deal of flexibility is realized.

5 Claims, 6 Drawing Sheets

CAPACITOR USING DIELECTRIC FILM

This application is a continuation application under 37 C.F.R., §1.62 of prior application Ser. No. 08/493,528, filed on Jun. 22, 1995 abandoned. Which is a continuation of application Ser. No. 08/276,483 on Jul. 18, 1994 abandoned. Which is a continuation of application Ser. No. 07/966,642 filed on Oct. 26, 1992 abandoned, entitled CAPACITOR USING DIELECTRIC FILM.

FIELD OF THE INVENTION

The present invention relates to a capacitor using a dielectric film, and more particularly to a capacitor using dielectric film of which capacity and coercive field can be easily in accordance with applications.

BACKGROUND OF THE INVENTION

Conventionally, capacitors having a desired capacity are individually formed in such a manner that a lower filmy electrode, a dielectric film and an upper filmy electrode are in turn formed on an insulating substrate and the lamination of the lower filmy electrode, the dielectric film and the upper filmy electrode is sized suitably in its area and thickness. In a monitor for applied voltage utilizing a ferroelectric capacitor, a value of the applied voltage is distinguished by taking advantage of the coercive field of the ferroelectrics. Previously polarized capacitors of different coercive fields are ready for monitoring and the voltage to be monitored is applied to the capacitors. If the applied voltage is greater than a coercive field of one capacitor, its polarized direction is reversed and if lower than the coercive field, its polarized direction is not reversed. This is taken advantage of in the monitoring. Thus, the applied voltage can be monitored by judging the polarized condition of each capacitor.

A coercive field varies depending on material and thickness of ferroelectrics, so that in order to obtain capacitors of different coercive fields, capacitors having ferroelectrics are of different materials, or thicknesses, from each other must be individually formed. Thus, the number of producing steps increases proportionally to the number of kinds of required capacitors.

Required capacity and other characteristics of capacitors can be estimated to some extent from their applications. However, a specific value thereof must be individually set by calculating from users' order.

On the other hand, even in the case where the characteristics are controlled with only the thickness variation of the ferroelectrics, it takes a long time to form or process a thick ferroelectric film for individually obtaining desired capacitors. Further, it is difficult to minimize errors in producing films of different thicknesses. Thus, it is difficult to accommodate users' requirements timely.

SUMMARY OF THE INVENTION

In view of the above-mentioned problems, an object of the present invention is to timely serve a capacitor, in a short time, having desired characteristics such as capacity and coercive field in response to users' requirements.

According to the present invention there is provided a capacitor using a dielectric film wherein plural capacitor units each comprising one or two capacitor elements are formed on an insulator and upper electrodes of at least two capacitor elements of different capacitor units are electrically connected, each of the capacitor elements comprising a lower filmy electrode, a dielectric film formed on the lower filmy electrode, and an upper filmy electrode formed on the dielectric film.

According to the present invention, previously formed capacitor units employing dielectric film the same thickness are interconnected to form a capacitor so that a capacitor of desired characteristics can be easily realized.

In the case where a capacitor having a desired capacity is needed, it can be obtained by only interconnecting capacitor units in series or in parallel as appropriate. In the case where the coercive field is varied, the corresponding number of capacitor units are interconnected in series. For example, in a case where a coercive field corresponding to four times the thickness of the dielectric film is required, four capacitor units are interconnected in series, and in the case of six times, six capacitor units are interconnected in series.

As to the interconnection, only upper electrodes of required capacitor units are interconnected. Thanks to this, it can be obtained only with patterning the upper electrodes according to an order, thus, a desired capacitor can be produced quickly.

If an electrode terminal is taken out from the electrode connecting two units which adjoin to each other, it is possible to make this capacitor serve as one having different thicknesses of the dielectric film by optional connection of the terminal at a users' side.

In the case where two capacitor elements are interconnected in series with their lower filmy electrodes being integrated to form a capacitor unit so that the connection is carried out with only their upper electrodes, series connection with an odd number of capacitor elements cannot be realized. However, in this case, there is no need for providing any electrode terminals at their lower electrodes, and thus the unit can be easily produced. Even in the case where a connection with an odd number of capacitor elements is required, if dielectric electrode films of capacitors are made thin, a connection with an even number of capacitors can give the same effect as that of an odd number of capacitor elements.

DETAILED DESCRIPTION OF THE PREFERRED EMBODIMENT

Figure 1:
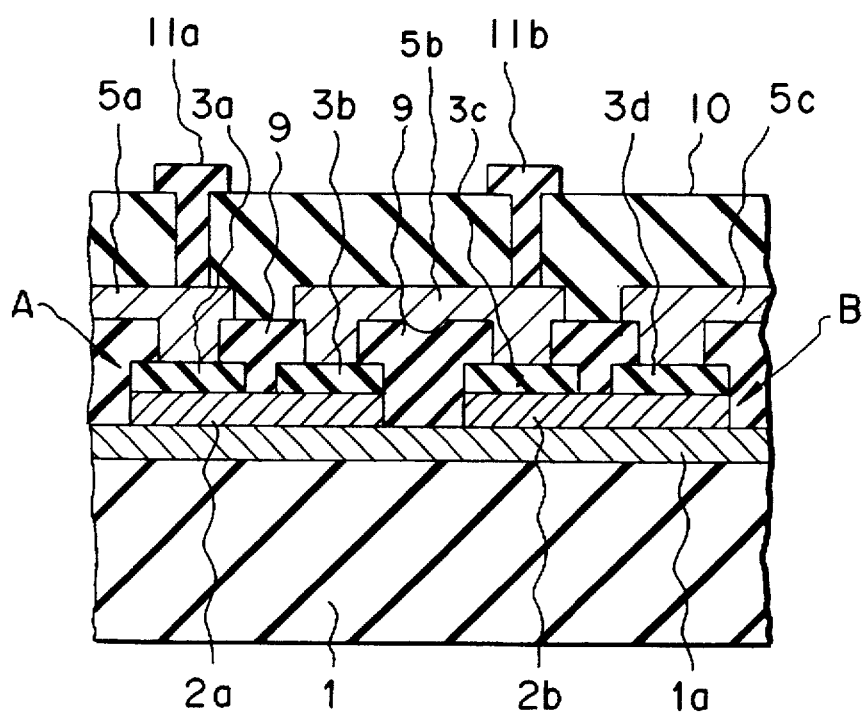
FIG. 1 is an explanatory sectional view partially showing an embodiment of a capacitor using a ferroelectric film of the present invention.

The present invention is explained below with reference to the drawings. FIG. 1 is a cross section showing an embodiment of the present invention, where two capacitor units A and B are arranged.

In FIG. 1, numeral 1 represents an insulator comprising a semiconductor substrate and an insulating film 1a formed thereon. Numeral 2 (2a and 2b) represents a lower filmy electrode. Numeral 3 (3a, 3b, 3c and 3d) represents a ferroelectric film. Numeral 5 (5a, 5b and 5c) represents an upper filmy electrode. Numeral 9 and 10 respectively represent an insulating film between layers and a passivation film. Symbols A and B respectively represent a first capacitor unit and a second capacitor unit. And capacitor unit A and B respectively comprise two capacitor elements.

Two ferroelectric films 3a and 3b are formed on the lower electrode 2a of the capacitor unit A. The upper electrodes 5a and 5b are respectively formed on the ferroelectric films 3a and 3b. The electrode 5b is connected to the upper surface of the ferroelectric film 3c of a capacitor element of the capacitor unit B. The lower electrode 2a forms a common electrode for the films 3a and 3b and similarly the lower electrode 2b forms a common electrode for the films 3c and 3d. Thus, in this embodiment, four ferroelectric films 3a, 3b, 3c and 3d are connected in series between the upper electrodes 5a and 5c through the films 2a, 2b and 5b.

Figure 2:
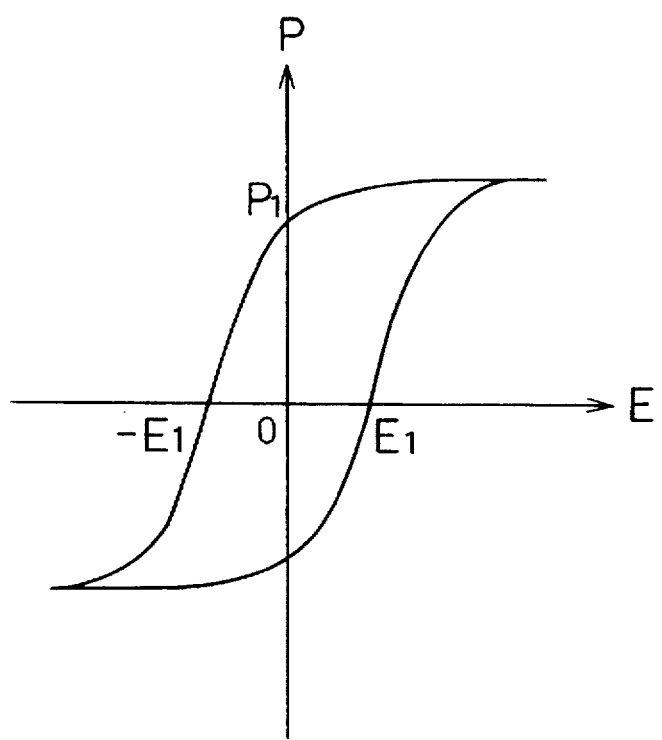
FIG. 2 is a graph showing polarization characteristics of a ferroelectric film.

The ferroelectric film is polarized when placed in an electrical field. As the electrical field is weakened, the polarization P is reduced, however, even if the electrical field is made 0, a polarization $P_1$ is left (refer to FIG. 2). If the electrical field is further weakened to a certain value, the polarization is made 0. The absolute value $|E_1|$ of the electrical field at this condition is defined as a coercive field. The coercive field varies depending on the thickness of a ferroelectric film. Accordingly, the thickness of a ferroelectric film is determined depending on rough value of voltage to be monitored, and in the present invention the determination of the thickness can be had with a series connection of the capacitors.

Figure 3:
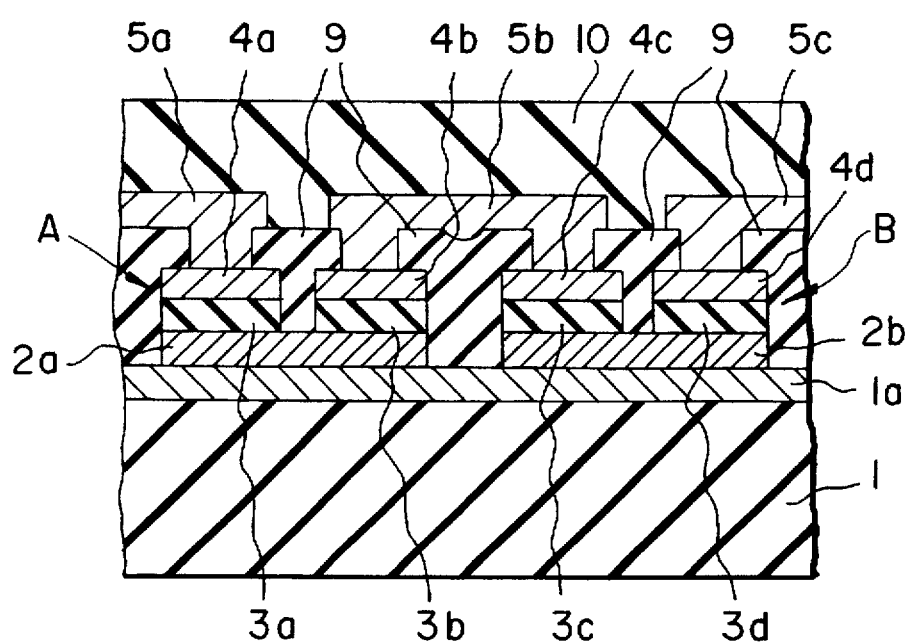
FIG. 3 is an explanatory sectional view partially showing another embodiment of a capacitor of the present invention.

The thickness of the ferroelectric film is important in this capacitor, and its area is not very important. For this reason, the upper electrodes are also used as filmy electrodes for wiring, however, as shown in FIG. 3, filmy wirings 5a, 5b and 5c might be formed on upper film electrodes 4a, 4b, 4c and 4d respectively formed on ferroelectric films 3a, 3b, 3c and 3d in the same area. In the case where capacity, not coercive field, is important, for example when a paraelectric film is used instead of the ferroelectric film, the upper electrodes also must be formed as shown in FIG. 3.

In this embodiment, four capacitor elements are connected in series, however, the number of capacitor elements is not limited to four and a required number of capacitor elements for a necessary coercive field can be connected in series. Since no electrode terminals are provided at the lower electrode 2, the series connection is always constituted with an even number of capacitor elements. However, if the ferroelectric film of each capacitor element is made thin, a coercive field can be minutely adjusted. This is more preferable, in producing, than providing an electrode terminal at the lower electrode 2 because of simplicity.

Figure 4:
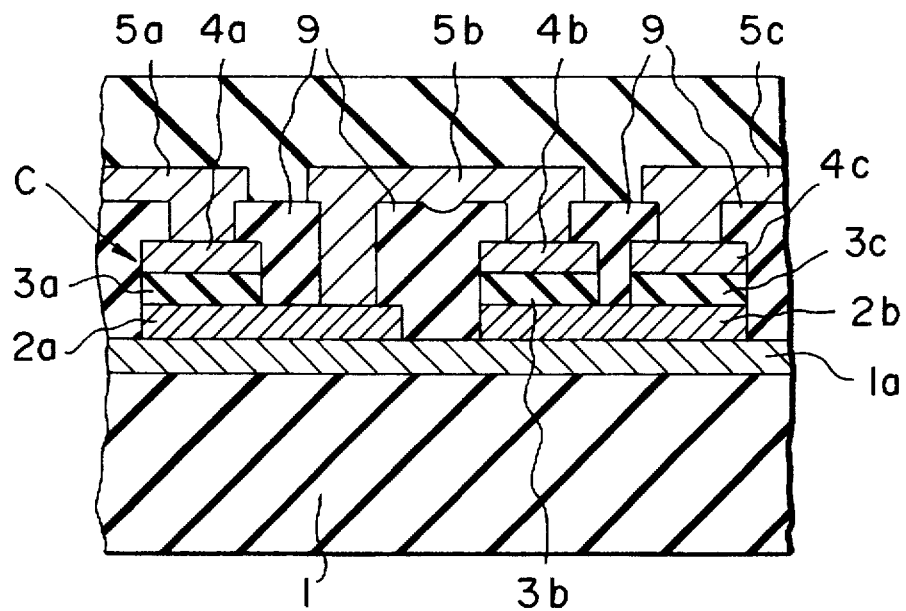
FIG. 4 is an explanatory sectional view partially showing a further embodiment of a capacitor of the present invention.

If one capacitor unit comprising one capacitor element is ready, a series connection constituted with an odd number of capacitor elements can be realized. This is shown in FIG. 4. In FIG. 4, each numeral represents the same element as those in FIGS. 1 and 3, and the symbol C represents a third capacitor unit comprising one capacitor element. The lower filmy electrode 2a of the third capacitor unit C is lengthened. Before formation of the electrode 5b, an opening is formed in the insulating film 9 to expose the lower electrode 2a, whereby the lower electrode 2a and the upper electrode 4a can be interconnected with the electrode 5b.

If each ferroelectric film is formed in the same thickness, a coercive field multiplied by the number of capacitor units connected in series is achieved. This is convenient in calculation of coercive field or the like.

After formation of the insulating film 9 is completed, the substrate is left as it is, where the upper electrodes are not still formed. When a monitor voltage ordered from a user is determined, how many capacitor units are connected in series is determined and then formation of the upper electrodes is carried out. Thus, a capacitor having a desired coercive field can be produced quickly.

If an electrode terminal (11a or 11b) is provided at each connecting electrode between capacitor units, for example, from the upper electrode 5b between the first capacitor unit A and the second capacitor unit B, a user can use suitable terminal where the desired number of capacitor units are connected in series. Thus, a capacitor of a great deal of flexibility is realized.

In the above embodiments, a ferroelectric film is employed in capacitors, however, the present invention is not limited to use ferroelectric film and an ordinary paraelectric film can replace the ferroelectric film.

Figure 9:
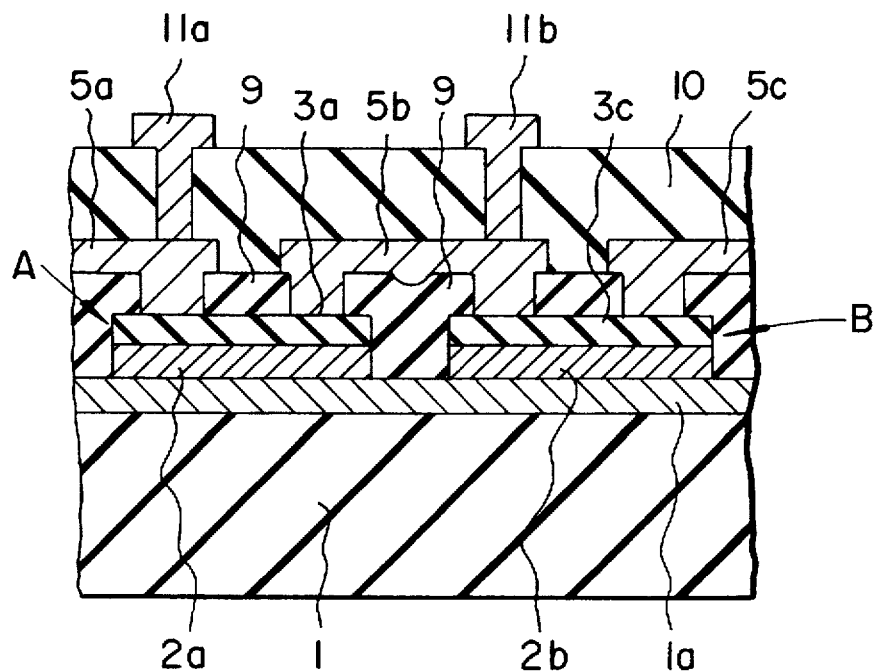
FIG. 9 is an explanatory sectional view partially showing another embodiment of a ferroelectric capacitor according to the present invention.

In the above embodiments, the ferroelectric film formed on the lower electrode 2a is divided in two parts (3a and 3b). However, as shown in FIG. 9, if the upper electrodes are divided, the ferroelectric film is not necessarily divided because only a ferroelectric film sandwiched between the electrodes and applied with electrical field is polarized. The ferroelectric film not applied with electrical field is not polarized at all. Note that in FIG. 9 like reference numerals are used to denote like parts of FIG. 1.

Hereinafter, a method for producing a capacitor of the present invention is explained below. FIGS. 5 to 8 are respectively a cross section showing each step of the method.

Figure 5:
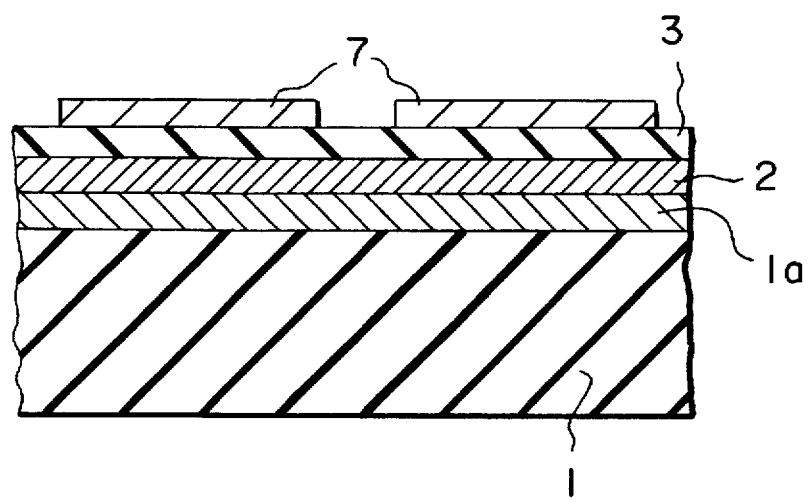
FIGS. 5 to 8 are respectively an explanatory sectional view showing each step in producing a capacitor using a ferroelectric film of the present invention.

As shown in FIG. 5, on an insulator substrate 1 comprising a semiconductor substrate and an insulating film 1a formed on the semiconductor substrate, a lower filmy electrode 2 and a ferroelectric film 3 are formed. Then, a resist film 7 for patterning is formed thereon. Specifically, a platinum film intended for a lower electrode was formed about 0.2 μm in thickness by sputtering, and then a PZT (Pb($Zr_{1-x}Ti_x$)$O_3$) film was formed thereon about 0.3 μm in thickness by sputtering. Thereafter a resist film 7 was formed and the laminated platinum film and the PZT film were sized into each capacitor unit by patterning.

Though a semiconductor substrate on which an insulating film is formed is used as an insulator substrate here, any materials can replace it as long as they are insulators. Platinum is used for a lower filmy electrode because of its good adhesion with a ferroelectric film of PZT. However, materials other than platinum such, as aluminium and polycrystal silicon doped with impurities can be used depending on the materials of the dielectric film. PZT is used for a ferroelectric film because it has a perovskite structure and its spontaneous polarization is high. However any kind of dielectric material can be used depending on individual purposes.

Figure 6:
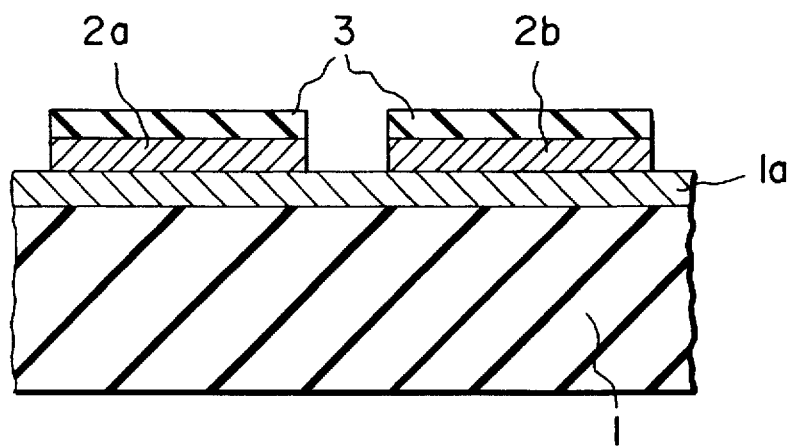

As shown in FIG. 6, the lamination of the ferroelectric film 3 and the lower electrode 2 is etched with the resist film 7 being used as a mask so that the lower electrode 2 is divided into two parts (2a and 2b). Specifically, the film 3 and the electrode 2 were etched successively by ion milling. In such successive ion milling, there are some cases where the resist film 7 is spoiled and it must be repatterned. In view of this problem, it is considered that the lower electrode is formed and then divided by etching, and thereafter, the ferroelectric film is formed and then etched. However in this case, the etching of the ferroelectric film must be performed against different thickess. Thus, it is difficult to etch the ferroelectric film.

Figure 7:
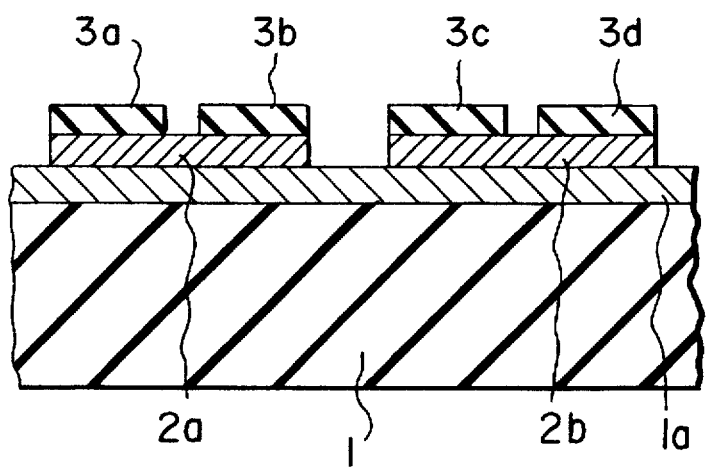

As shown in FIG. 7, a resist film is applied again and then the ferroelectric films 3 on the lower electrode 2a and 2b are respectively divided into four parts (3a, 3b, 3c and 3d). In particular, a resist film was formed and then etching was performed with ion milling like in the above-mentioned step.

As explained above, even if the ferroelectric film is not divided, there is no influence on capacitor characteristics. For this reason, this step can be omitted.

Figure 8:
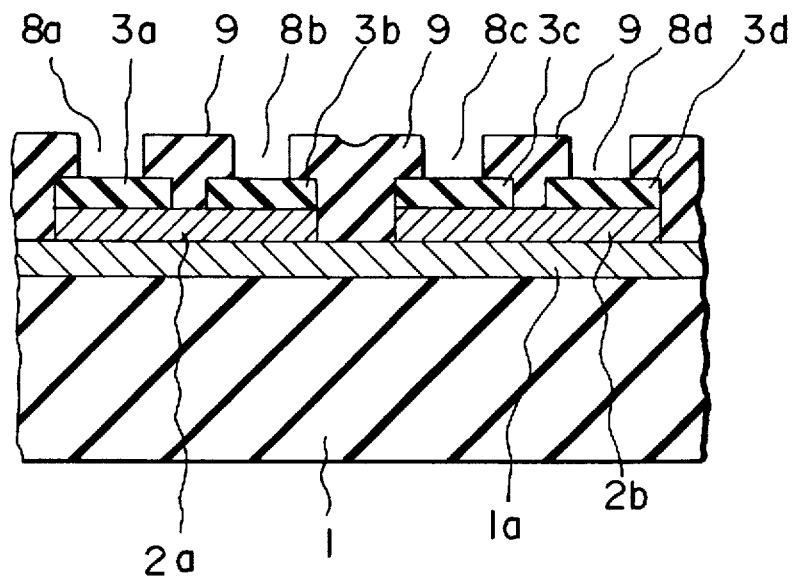

As shown in FIG. 8, insulating film 9 between elements is formed and then openings 8a, 8b, 8c and 8d are formed at positions where upper electrodes are to be formed. In particular, a silicon dioxide film 9 was formed by CVD method and then the openings 8 (8a, 8b, 8c and 8d) were formed by etching.

Upper filmy electrodes 5a, 5b and 5c are formed with ordinary semiconductor producing technique and then a passivation film 10 is formed, whereby a dielectric film capacitor as shown in FIG. 1 can be realized. However, if left in the condition as shown in FIG. 8, it is possible to quickly produce capacitors satisfying users' requirement because it can suffice with only forming the upper electrodes according to a users' requirements.

As explained above, in the present invention plural capacitor units each comprising one or two capacitor elements are formed on an insulator substrate and they can be suitably connected. Therefore, capacitor having desired characteristics can be easily produced.

In the case where ferroelectrics is used as a dielectric film to form a capacitor unit, the mere connection of upper electrodes brings a capacitor corresponding to one having a ferroelectric film of desired thickness. Thanks to this, a capacitor having a desired characteristics can be much quickly produced after determination of users' requirement. Further, users can make a capacitor of a desired coercive field by only connecting corresponding electrode terminals. Thus, a capacitor of the present invention has a great deal of flexibility.

Even in the case where a capacitor employing a thick ferroelectric film comprising PZT, which is hard to process is required, if many capacitors employing thin ferroelectric film are connected in series with upper electrodes, a capacitor corresponding to one employing, thick ferroelectric film can be realized. Thus, with a simple producing process, a capacitor having a high coercive field can be realized.

As a result, a capacitor having a great deal of flexibility and having low cost can be realized, whereby desirability is significantly increased.

Though several embodiments of the present invention are described above, it is to be understood that the present invention is not limited only to the above-mentioned, embodiments. Various changes and modifications may be made in the invention without departing from the spirit and scope thereof.

What is claimed is:

1. A ferroelectric capacitor comprising:

an electrically insulating substrate; and plural ferroelectric capacitor units formed on said substrate, each ferroelectric capacitor unit including two capacitor elements, wherein each of the capacitor elements include a lower filmy electrode, a ferroelectric film formed on the lower filmy electrode, and an upper filmy electrode formed on the ferroelectric film, wherein the lower filmy electrodes of the two capacitor elements are continuously formed, and the upper filmy electrodes of the two capacitor elements are separated from each other, the two capacitor elements being serially connected to each other by the lower filmy electrode, wherein each of said ferroelectric capacitor units is provided with an electrode terminal for external connection and wherein at least two of the ferroelectric capacitor units are electrically serially connected to each other by serial connecting means, said serial connecting means being a wiring connecting the upper filmy electrodes, to adjust a coercive field and wherein one of said electrode terminals for external connection for one of said ferroelectric units is connected to said serial connecting means.

2. The ferroelectric capacitor of claim 1, wherein the ferroelectric films of the two capacitor elements of each ferroelectric capacitor unit are continuously formed.

3. The ferroelectric capacitor of claims 1, wherein the ferroelectric films of said ferroelectric capacitor units are formed having a same thickness.

4. The ferroelectric capacitor of claim 1 to 3, wherein the insulating substrate is composed of a semiconductor substrate formed with an insulating film on a surface thereof.

5. A ferroelectric capacitor comprising:

an electrically insulating substrate; and plural ferroelectric capacitor units formed on said substrate, each ferroelectric capacitor unit including two capacitor elements, wherein each of the capacitor elements include a lower filmy electrode, a ferroelectric film formed on the lower filmy electrode, and an upper filmy electrode formed on the ferroelectric film, wherein the lower filmy electrodes of the two capacitor elements are continuously formed, and the upper filmy electrodes of the two capacitor elements are separated from each other, the two capacitor elements being serially connected to each other by the lower filmy electrode, wherein each of said ferroelectric capacitor units is provided with an electrode terminal for external connection and wherein at least two of the ferroelectric capacitor units are electrically serially connected to each other by serial connecting means, said serial connecting means being the upper filmy electrodes thereof, to adjust a coercive field and wherein one of said electrode terminals for external connection for one of said ferroelectric units is connected to said serial connecting means.

* * * * *